(12) United States Patent
Shibata et al.

(10) Patent No.: US 12,120,829 B2
(45) Date of Patent: Oct. 15, 2024

(54) WIRING CIRCUIT BOARD ASSEMBLY SHEET

(71) Applicant: NITTO DENKO CORPORATION, Osaka (JP)

(72) Inventors: Shusaku Shibata, Osaka (JP); Shun Shiga, Osaka (JP); Teppei Niino, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 161 days.

(21) Appl. No.: 17/913,055

(22) PCT Filed: Mar. 5, 2021

(86) PCT No.: PCT/JP2021/008728
§ 371 (c)(1),
(2) Date: Sep. 20, 2022

(87) PCT Pub. No.: WO2021/192926
PCT Pub. Date: Sep. 30, 2021

(65) Prior Publication Data
US 2023/0345640 A1 Oct. 26, 2023

(30) Foreign Application Priority Data
Mar. 24, 2020 (JP) .................. 2020-051960

(51) Int. Cl.
*H05K 3/00* (2006.01)
*H05K 1/11* (2006.01)
(Continued)

(52) U.S. Cl.
CPC .......... *H05K 3/0097* (2013.01); *H05K 1/118* (2013.01); *H05K 3/28* (2013.01); *H05K 3/4608* (2013.01);
(Continued)

(58) Field of Classification Search
CPC ......... H05K 2201/09781; H05K 1/056; H05K 3/0097
See application file for complete search history.

(56) References Cited

U.S. PATENT DOCUMENTS

2005/0053868 A1   3/2005 Naito
2007/0069360 A1   3/2007 Yoon et al.
(Continued)

FOREIGN PATENT DOCUMENTS

JP   2005-085944 A   3/2005
JP   2005-183879 A   7/2005
(Continued)

OTHER PUBLICATIONS

International Search Report issued in PCT/JP2021/008728 on May 25, 2021.
(Continued)

*Primary Examiner* — Sherman Ng
(74) *Attorney, Agent, or Firm* — Edwards Neils LLC; Jean C. Edwards, Esq.

(57) ABSTRACT

An assembly sheet as a wiring circuit board assembly sheet includes a metal substrate, a wiring circuit structure portion, and a dummy structure portion. The metal substrate includes a product region and a frame region adjacent thereto. The wiring circuit structure portion is disposed on one surface in a thickness direction of the metal substrate in the product region, and includes a terminal portion. The dummy structure portion is disposed on one surface in the thickness direction of the metal substrate in the frame region, includes a plurality of conductive layers aligned in the thickness direction, and has a greater height above the metal substrate than the terminal portion.

9 Claims, 10 Drawing Sheets

(51) Int. Cl.
*H05K 3/28* (2006.01)
*H05K 3/46* (2006.01)

(52) U.S. Cl.
CPC .............. *H05K 2203/1545* (2013.01); *H05K 2203/308* (2013.01)

(56) References Cited

U.S. PATENT DOCUMENTS

| | | | | |
|---|---|---|---|---|
| 2009/0096069 | A1* | 4/2009 | Ishimaru | H05K 1/111 257/666 |
| 2010/0142097 | A1* | 6/2010 | Kawano | H05K 1/0271 174/255 |
| 2012/0033395 | A1* | 2/2012 | Ishii | H05K 3/0097 29/829 |
| 2014/0313619 | A1 | 10/2014 | Sugimoto et al. | |
| 2021/0185826 | A1 | 6/2021 | Taniuchi et al. | |

FOREIGN PATENT DOCUMENTS

| | | |
|---|---|---|
| JP | 2007-096314 A | 4/2007 |
| JP | 2010-087396 A | 4/2010 |
| JP | 2012-038914 A | 2/2012 |
| JP | 2014-211929 A | 11/2014 |
| JP | 2020-027848 A | 2/2020 |

OTHER PUBLICATIONS

Written Opinion issued in PCT/JP2021/008728 on May 25, 2021.
Notification of Reasons for Refusal issued in Japanese Patent Application No. 2020-051960 on Aug. 24, 2021.
International Preliminary Report on Patentability issued by WIPO on Sep. 22, 2022, in connection with International Patent Application No. PCT/JP2021/008728.
Office Action, issued by the Taiwanese Intellectual Property Office on Aug. 5, 2024, in connection with Taiwanese Patent Application No. 110108895.

* cited by examiner

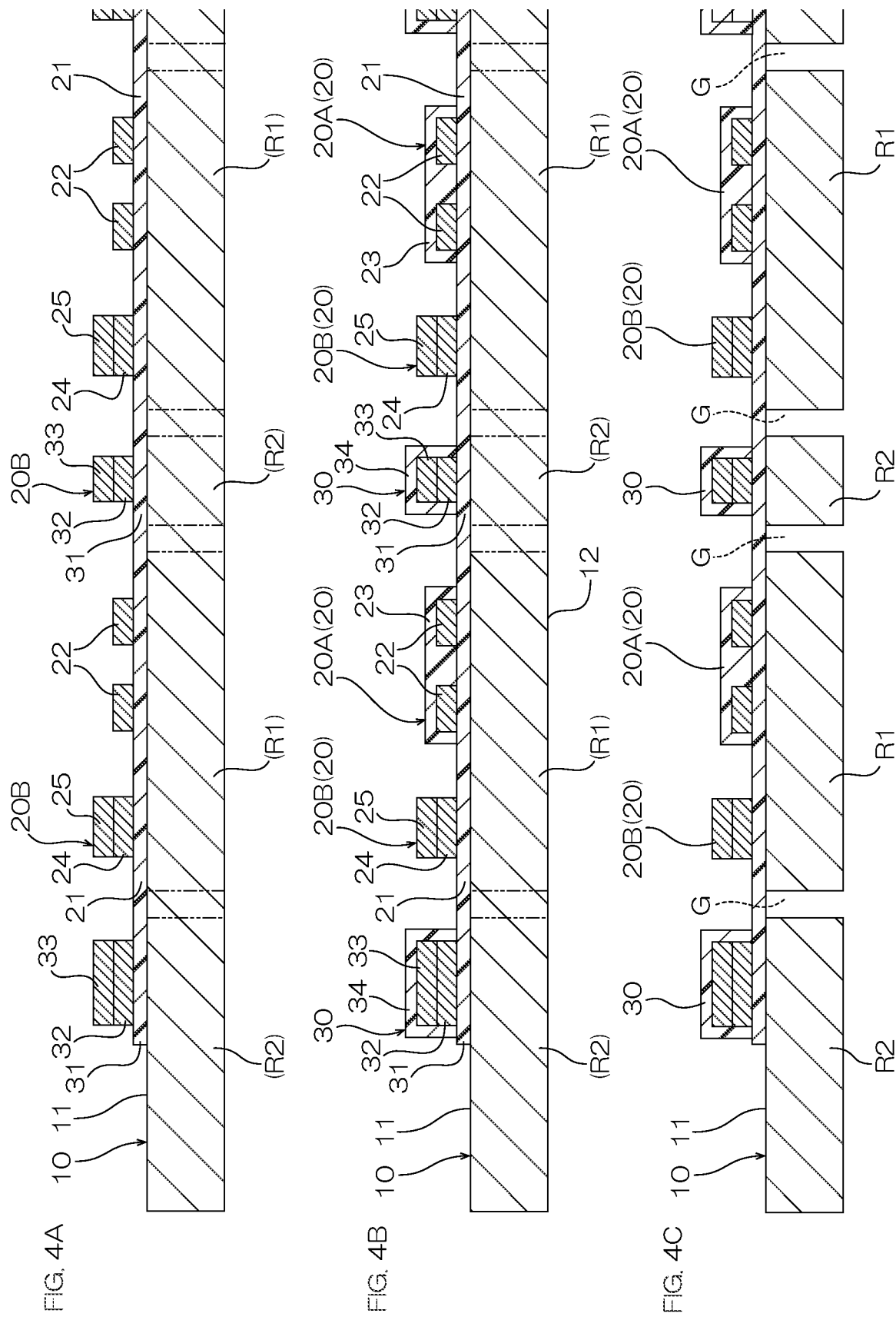

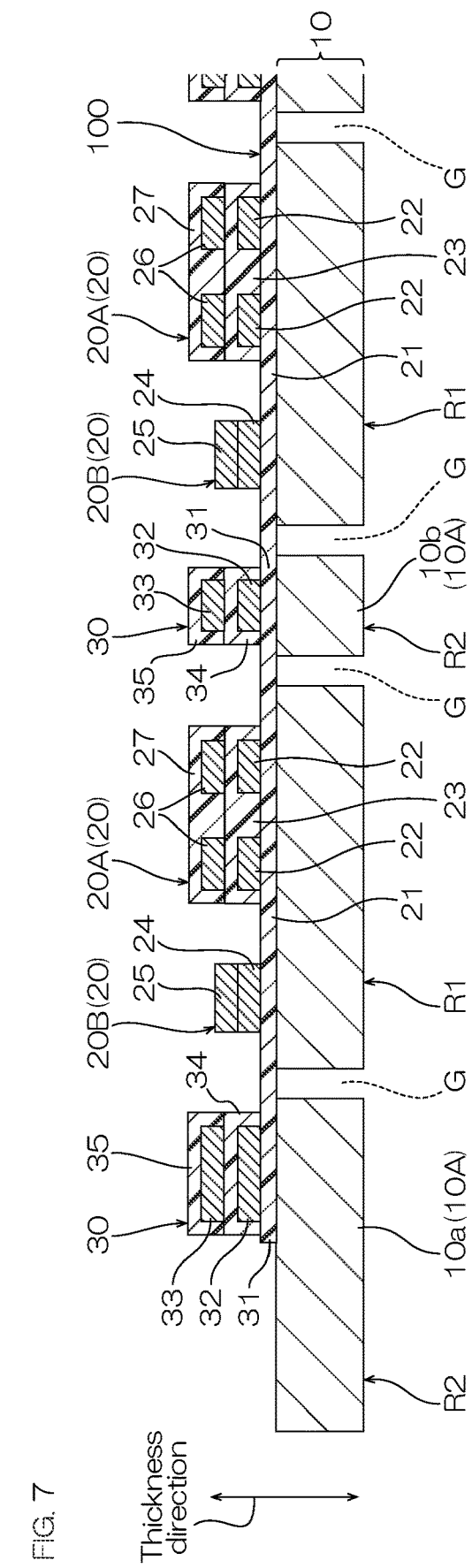

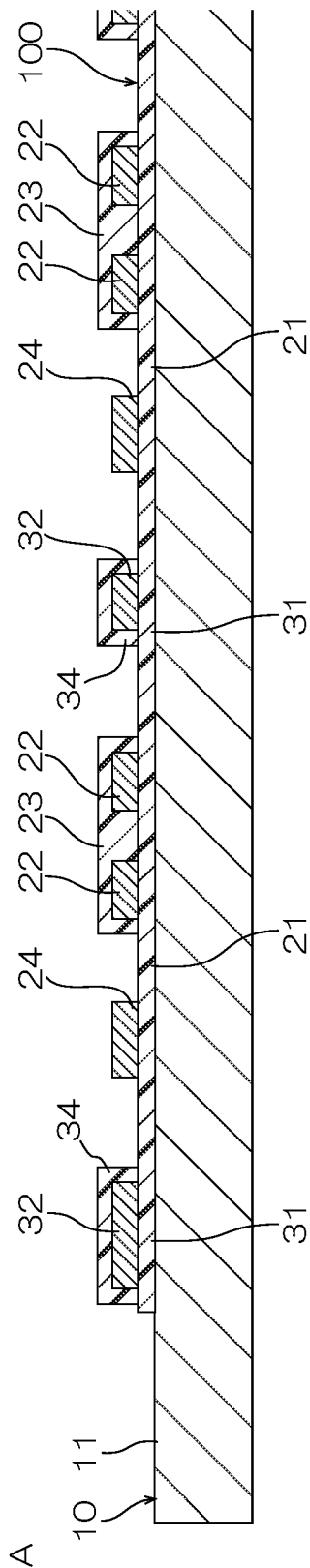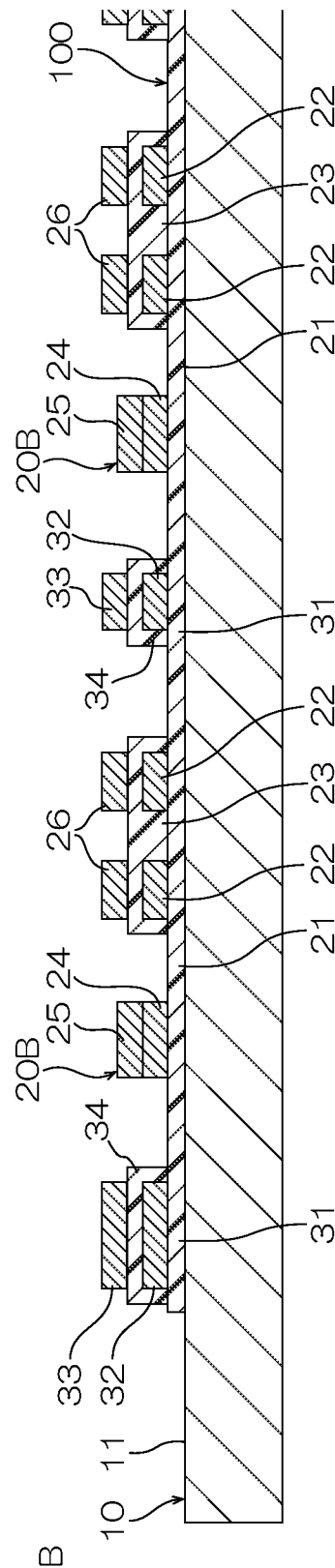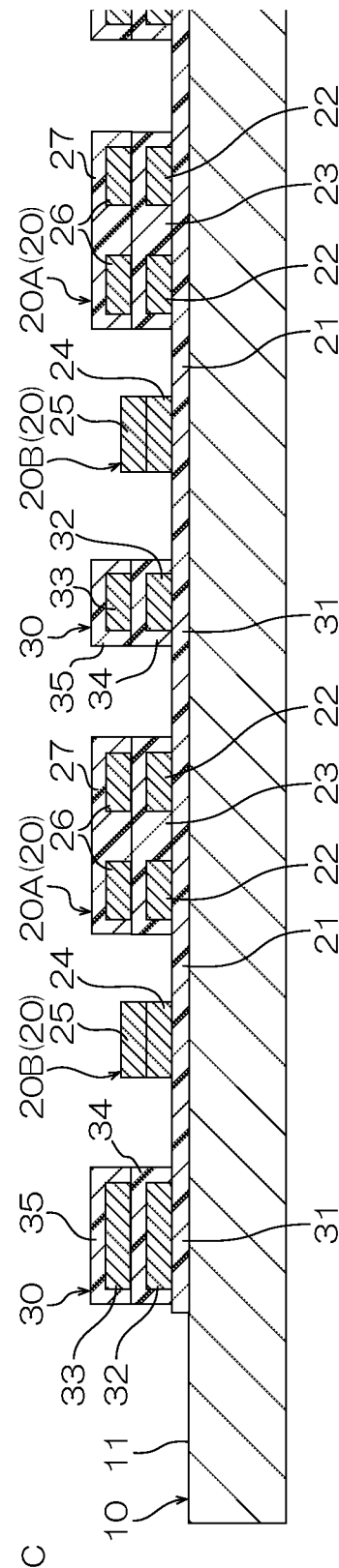

WIRING CIRCUIT BOARD ASSEMBLY SHEET

CROSS-REFERENCE TO RELATED APPLICATIONS

The present application is a 35 U.S.C. 371 National Stage Entry of for PCT/JP2021/008728, filed on Mar. 5, 2021, which claims priority from Japanese Patent Application No. 2020-051960, filed on Mar. 24, 2020, the contents of all of which are herein incorporated by reference in their entirety.

TECHNICAL FIELD

The present invention relates to a wiring circuit board assembly sheet.

BACKGROUND ART

A wiring circuit board having a metal substrate as a support substrate has been known. An example thereof includes a suspension board with circuit which is assembled into a hard disk drive or the like. In a production process of the wiring circuit board having a metal substrate, various insulating layers, and conductive portions such as wirings and terminal portions are formed on the metal substrate. Each step included in the production process may be carried out in a so-called roll-to-roll method from the viewpoint of production efficiency. For a technique relating to a method for producing a wiring circuit board in a roll-to-roll method is described in, for example, Patent Document 1 below.

CITATION LIST

Patent Document

Patent Document 1: Japanese Unexamined Patent Publication No. 2005-85944

SUMMARY OF THE INVENTION

Problem to be Solved by the Invention

When the wiring circuit board having a metal substrate as a support substrate is produced in a roll-to-roll method, a long metal substrate is used as a substrate to which a wiring circuit forming process is applied, and an assembly sheet which substantially includes a plurality of wiring circuit boards is fabricated from the long metal substrate.

The wiring circuit board assembly sheet takes a form of a roll during its conveyance, storage, or the like. In the wiring circuit board assembly sheet taking the form of the roll, a wiring circuit structure portion formed on the metal substrate in each product region (portion to be a single wiring circuit board by being cut off from a frame region provided in the assembly sheet) is in contact with the metal substrate adjacent thereto in a roll radial direction. For example, a terminal portion for external connection included in the wiring circuit structure portion has a surface which is not covered with an insulating layer, and is conventionally easily damaged due to the contact with the adjacent metal substrate. Such damage of the terminal portion may cause connection failure, which is undesirable.

The present invention provides a wiring circuit board assembly sheet suitable for suppressing damage to a terminal portion of a wiring circuit structure portion in a product region.

Means for Solving the Problem

The present invention [1] includes a wiring circuit board assembly sheet including a metal substrate including a product region and a frame region adjacent to the product region, a wiring circuit structure portion including a terminal portion and disposed on one surface in a thickness direction of the metal substrate in the product region, and a dummy structure portion disposed on one surface in the thickness direction of the metal substrate in the frame region, wherein the dummy structure portion includes a plurality of dummy conductive layers aligned in the thickness direction and has a greater height above the metal substrate than the terminal portion.

The wring circuit board assembly sheet of the present invention, as described above, includes, at one surface-side in the thickness direction of the metal substrate, the dummy structure portion on the frame region having a height greater than the terminal portion on the product region. When the wiring circuit board assembly sheet takes a form of a roll, such a configuration is suitable for less causing the above-described contact between the terminal portion of the wiring circuit structure portion and the metal substrate adjacent to the terminal portion at one side in the thickness direction thereof, and is also suitable for reducing a load received by the terminal portion due to the above-described contact. In addition, in the wiring circuit board assembly sheet, as described above, the dummy structure portion includes the plurality of dummy conductive layers aligned in the thickness direction. Such a configuration is suitable for ensuring the height of the dummy structure portion greater than the terminal portion of the wiring circuit structure portion, and helps in the contact suppression and the reduction in the contact load described above between the terminal portion and the metal substrate. Therefore, the wiring circuit board assembly sheet is suitable for suppressing damage to the terminal portion of the wiring circuit structure portion in the product region.

The present invention [2] includes the wiring circuit board assembly sheet described in the above-described [1], wherein the plurality of dummy conductive layers of the dummy structure portion are laminated in the thickness direction.

Such a configuration is suitable for efficiently forming each dummy conductive layer of the dummy structure portion having the height greater than the terminal portion, for example, in parallel with the conductive layer of the terminal portion in a production process of the wiring circuit board assembly sheet.

The present invention [3] includes the wiring circuit board assembly sheet described in the above-described [1] or [2], wherein the wiring circuit structure portion includes a wiring portion, and the dummy structure portion has a greater height above the metal substrate than the wiring portion.

When the wiring circuit board assembly sheet takes the form of the roll, such a configuration is suitable for less causing the contact between the wiring portion of the wiring circuit structure portion formed on the metal substrate in each product region, and the metal substrate adjacent to the wiring portion at one side in the thickness direction thereof, and is also suitable for reducing the load received by the wiring portion due to the contact. Therefore, the configuration is suitable for suppressing damage to the wiring due to the contact with the metal substrate.

The present invention [4] includes the wiring circuit board assembly sheet described in the above-described [3], wherein the wiring portion of the wiring circuit structure portion includes a plurality of conductive layers aligned at spaced intervals from each other in the thickness direction, and the plurality of dummy conductive layers of the dummy structure portion are aligned at spaced intervals from each other in the thickness direction.

A configuration in which the wiring portion of the wiring circuit structure portion includes the plurality of conductive layers aligned at spaced intervals from each other in the thickness direction is suitable for realizing high wiring density. A configuration in which the plurality of dummy conductive layers of the dummy structure portion are aligned at spaced intervals from each other in the thickness direction is suitable for ensuring the height of the dummy structure portion greater than the wiring portion appropriate for high density.

The present invention [5] includes the wiring circuit board assembly sheet described in the above-described [4], wherein the terminal portion is thicker than the conductive layer of the wiring portion.

Such a configuration is suitable for ensuring the height of the terminal portion greater than the wiring portion.

The present invention [6] includes the wiring circuit board assembly sheet described in any one of the above-described [1] to [5], wherein the terminal portion includes a plurality of conductive layers laminated in the thickness direction.

Such a configuration is suitable for efficiently forming each dummy conductive layer of the dummy structure portion in parallel with each conductive layer of the terminal portion in the production process of the wiring circuit board assembly sheet.

The present invention [7] includes the wiring circuit board assembly sheet described in any one of the above-described [1] to [6], wherein the dummy structure portion includes an insulating layer covering the dummy conductive layer.

Such a configuration is suitable for ensuring the height of the dummy structure portion above the metal substrate greater than the height of the terminal portion.

The present invention [8] includes the wiring circuit board assembly sheet described in any one of the above-described [1] to [7], wherein the metal substrate extends in a first direction and has a width in a second direction perpendicular to the first direction, the frame region includes an extending portion extending in the first direction and being adjacent to the product region in the second direction, and the dummy structure portion extends in the first direction on the extending portion.

According to such a configuration, it is possible to enjoy the above-described technical effect by the dummy structure portion in the wiring circuit board assembly sheet over the entire region where the dummy structure portion extends in the first direction.

The present invention [9] includes the wiring circuit board assembly sheet described in any one of the above-described [1] to [7], wherein the metal substrate extends in a first direction, has a width in a second direction perpendicular to the first direction, and includes at least one row of product region row including a plurality of the product regions aligned in the first direction; the frame region includes at least one extending portion extending in the first direction and being adjacent to the product region row in the second direction; and the dummy structure portion is provided for each extending portion and extends in the first direction on the extending portion.

According to such a configuration, it is possible to enjoy the above-described technical effect by the dummy structure portion in the wiring circuit board assembly sheet over the entire region where the dummy structure portion extends extending in the first direction, for each product region row.

BRIEF DESCRIPTION OF THE DRAWINGS

FIG. 3A illustrating a preparing step,

FIG. 3B illustrating a first insulating layer forming step, and

FIG. 3C illustrating a first conductive layer forming step.

FIGS. 4A to 4C show steps subsequent to the steps shown in FIGS. 3A to 3C:

FIG. 4A illustrating a second conductive layer forming step,

FIG. 4B illustrating a second insulating layer forming step, and

FIG. 4C illustrating a step of forming an opening portion in a metal substrate.

FIG. 6A illustrating the dummy structure portion on an extending portion located in an end portion in a width direction of a metal substrate, and FIG. 6B illustrating a dummy structure portion on the extending portion located between extending portions of both end portions in the width direction.

FIG. 7 shows a partially cross-sectional schematic view in the width direction of the wiring circuit board assembly sheet including both configurations of the modified examples shown in FIGS. 5, 6A, and 6B.

FIGS. 8A to 8C show a part of steps in a method for producing the wiring circuit board assembly sheet shown in FIG. 7 as a change in a cross section corresponding to FIG. 7:

FIG. 8A illustrating a second insulating layer forming step,

FIG. 8B illustrating a second conductive layer forming step, and

FIG. 8C illustrating a third insulating layer forming step.

DESCRIPTION OF EMBODIMENTS

Figure 1:
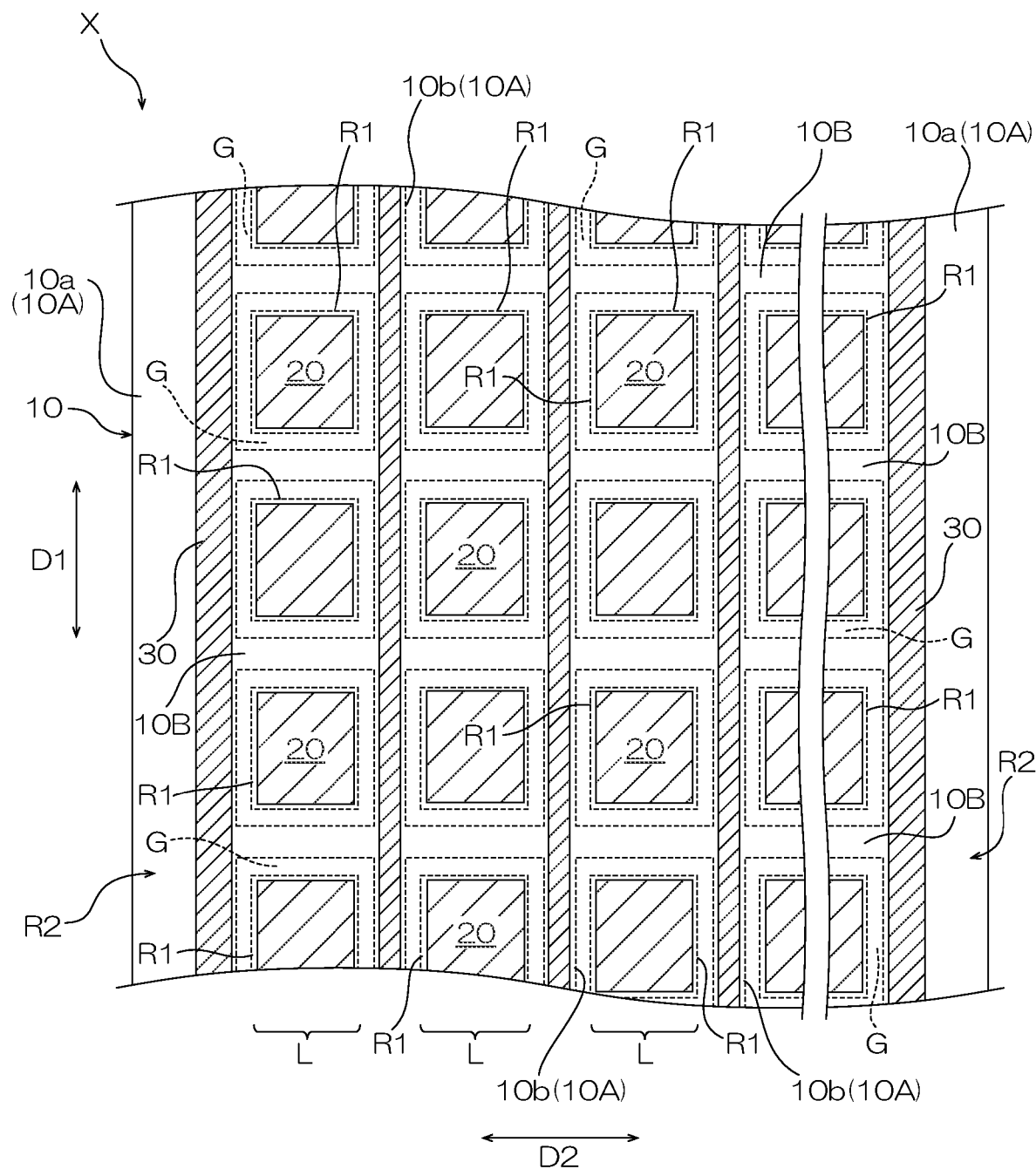
FIG. 1 shows a partially plan schematic view of one embodiment of a wiring circuit board assembly sheet of the present invention.
Figure 2:
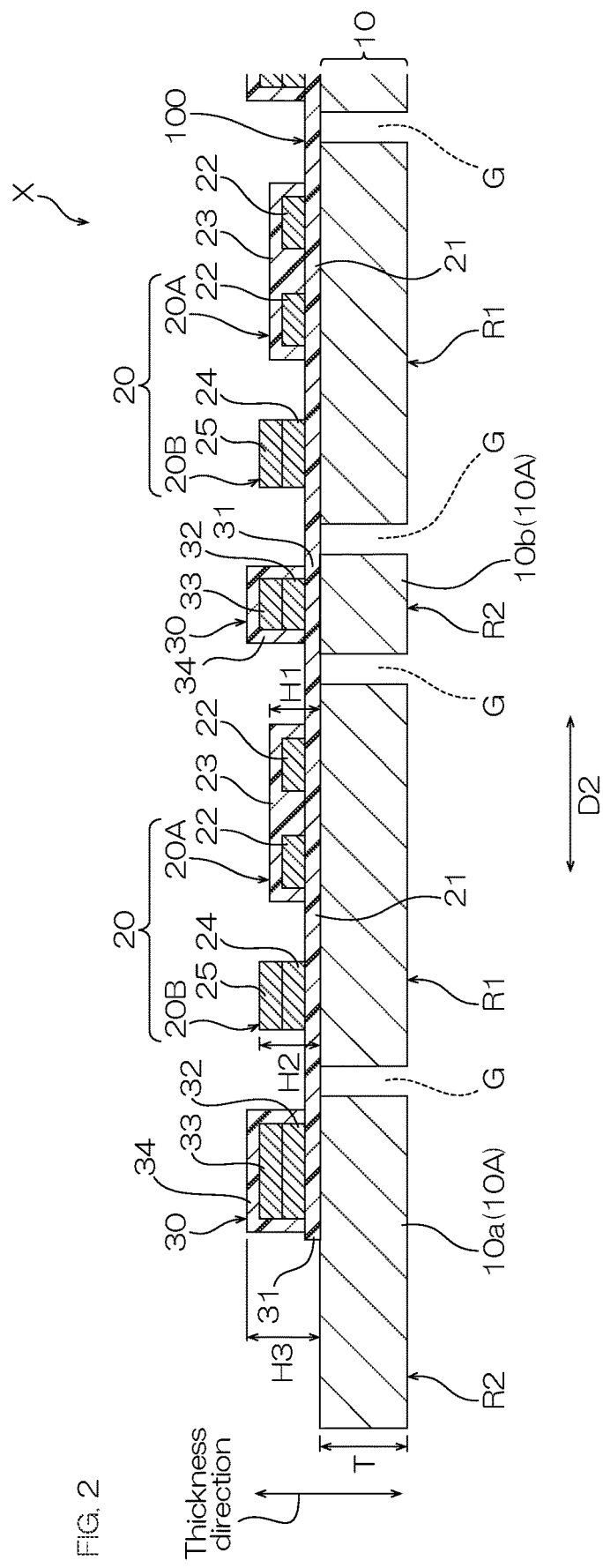
FIG. 2 shows a partially cross-sectional schematic view in a width direction of the wiring circuit board assembly sheet shown in FIG. 1.

FIGS. 1 and 2 show an assembly sheet X which is one embodiment of a wiring circuit board assembly sheet of the present invention. FIG. 1 shows a partially plan schematic view of the assembly sheet X. FIG. 2 shows a partially cross-sectional schematic view of the assembly sheet X.

The assembly sheet X includes a metal substrate 10, a wiring circuit structure portion 20, and a dummy structure portion 30.

The metal substrate 10 is a flexible substrate made of metal, and has a long sheet shape extending in one direction (first direction D1 shown in FIG. 1). A length of the metal substrate 10 in the first direction D1 is, for example, 1 to 500 m. The length (i.e., width) of the metal substrate 10 in a second direction D2 (width direction) perpendicular to the first direction D1 is, for example, 1 to 10 cm. A thickness T (length in a direction perpendicular to the first direction D1 and the second direction D2) of the metal substrate 10 is, for example, 10 μm or more, preferably 15 μm or more, more preferably 50 μm or more, and for example, 500 μm or less, preferably 300 μm or less.

The metal substrate 10 includes a plurality of product regions R1, and a frame region R2 forming a frame around each product region R1. Each product region R1 is a portion to be one wiring circuit board by being cut off, or isolated, from the assembly sheet X, and has a shape according to the design of the wiring circuit board which is a production object when viewed from the top (FIG. 1 illustratively shows a case where each product region R1 is rectangular when viewed from the top, and further, in FIG. 1, a contour of the product region R1, and a contour of the frame region R2 around it are shown in a broken line by seeing through an insulating layer 100 to be described later on one surface in a thickness direction of the metal substrate 10).

The plurality of product regions R1 are disposed in alignment in the metal substrate 10. In the present embodiment, the predetermined number of product regions R1 are disposed in one row at spaced intervals from each other in the first direction D1, thereby forming product region rows L. The plurality of product region rows L are disposed in parallel at spaced intervals from each other in the second direction D2. A length in the first direction D1 of the product region R1 is, for example, 1 to 100 mm. A length in the second direction D2 of the product region R1 is, for example, 1 to 100 mm. The number of rows of the product region row L is, for example, 1 to 500.

Each product region R1 and the frame region R2 are adjacent at spaced intervals therebetween. Further, the frame region R2 includes a plurality of extending portions 10A extending along the product region rows L. Each extending portion 10A extends in the first direction D1, and is adjacent to the product region row L in the second direction D2 through an opening portion G, or gap. In the present embodiment, the extending portion 10A and the product region row L are disposed in parallel at spaced intervals. Specifically, the plurality of extending portions 10A include two extending portions 10a located at both ends of the metal substrate 10 in the second direction D2 and an extending portion 10b other than these. The product region row L and the extending portion 10b, each extending in the first direction D1, are alternately located at spaced intervals between the two extending portions 10a. A length of the extending portion 10a in the second direction D2 (i.e., a width of the extending portion 10a) is, for example, 0.1 to 50 mm. A length (i.e., a width of the extending portion 10b) of the extending portion 10b in the second direction D2 is, for example, 0.1 to 50 mm. Preferably, the width of the extending portion 10a is wider than the width of the extending portion 10b. Further, a length of the opening portion G between the product region row L (the product region R1) and the extending portion 10A in the second direction D2 is, for example, 0.01 to 10 mm, where this length is a separation distance between the product region R1 and the extending portion 10A.

The frame region R2 includes a plurality of extending portions 10B traversing between the two extending portions 10a. Each extending portion 10B extends in the second direction D2, and is adjacent to the product region R1 in the first direction D1 through the opening portion G, or gap. A length of the extending portion 10B (i.e., a width of the extending portion 10B) in the first direction D1 is, for example, 0.1 to 50 mm. A length of the opening portion G between the product region R1 and the extending portion 10B in the first direction D1 is, for example, 0.01 to 10 mm, where this length is a separation distance between the product region R1 and the extending portion 10B.

Examples of a material for the metal substrate 10 include metal foils. Examples of a metal material for the metal foil include copper, copper alloy, stainless steel, and 42-alloy. An example of the stainless steel includes SUS304 based on a standard of AISI (American Iron and Steel Institute).

As shown in FIG. 2, the wiring circuit structure portion 20 is disposed on one surface in the thickness direction of the metal substrate 10 in the product region R1. The wiring circuit structure portion 20 has an insulating layer 21 (base insulating layer), a wiring portion 20A, and a terminal portion 20B. The insulating layer 21 in the wiring circuit structure portion 20 is, as described later with reference to FIG. 3B, a portion (portion located within the product region R1 of the metal substrate 10) of the insulating layer 100 which is pattern-formed on one surface in the thickness direction of the metal substrate 10. In FIG. 1, from the viewpoint of clarification, the contour of the wiring circuit structure portion 20 is shown by hatching, while separately shown from the contour of the product region R1 of the metal substrate 10.

The insulating layer 21 is located on one surface in the thickness direction of the metal substrate 10 in the product region R1. The insulating layer 21 includes the wiring portion 20A and the terminal portion 20B when viewed from the top. In the present embodiment, the insulating layer 21 is provided over the entire product region R1 when viewed from the top. Examples of a material for the insulating layer 21 include resin materials such as polyimide, polyether nitrile, polyether sulfone, polyethylene terephthalate, polyethylene naphthalate, and polyvinyl chloride (the same resin materials apply to a material for insulating layers 23, 31, and 34 to be described later). A thickness of the insulating layer 21 is, for example, 1 μm or more, preferably 3 μm or more, and for example, 35 μm or less, preferably 15 μm or less.

The wiring portion 20A is located on one surface in the thickness direction of the insulating layer 21. In the present embodiment, the wiring portion 20A includes a conductive layer 22 (first conductive layer) forming a wiring, and the insulating layer 23 (first cover insulating layer).

The conductive layer 22 has a predetermined pattern shape on one surface in the thickness direction of the insulating layer 21. A thickness of the conductive layer 22 is, for example, 3 μm or more, preferably 5 μm or more, and for example, 50 μm or less, preferably 30 μm or less. A width of the conductive layer 22 (dimension in a direction perpendicular to an extending direction of the conductive layer 22) is, for example, 5 μm or more, preferably 8 μm or more, and for example, 100 μm or less, preferably 50 μm or less. FIG. 2 includes a cross-sectional schematic view of a partial structure portion where the two conductive layers 22 extend in parallel on the insulating layer 21 in a case where the wiring circuit structure portion 20 has such a partial structure portion. A distance between the conductive layers 22 extending in parallel on the insulating layer 21 is, for example, 5 μm or more, preferably 8 μm or more. Examples of a material for the conductive layer 22 include metal materials such as copper, nickel, gold, solder, and alloys of these, and preferably, copper is used (the same applies to materials for conductive layers 24, 25, 32, and 33 to be described later).

The insulating layer 23 is disposed on one surface in the thickness direction of the insulating layer 21 so as to cover the conductive layer 22, and has a predetermined pattern shape when viewed from the top. A height of the insulating layer 23 from the insulating layer 21 (distance from the insulating layer 21 to the upper end of the insulating layer 23 in FIG. 2) is, for example, 4 μm or more, preferably 6 μm or more, and for example, 60 μm or less, preferably 40 μm or less, as long as it is larger than the thickness of the conductive layer 22.

A height H1 of the wiring portion 20A from the metal substrate 10 (distance from the metal substrate 10 to the upper end of the wiring portion 20A in the drawing) is, for example, 5 μm or more, preferably 7 μm or more, and for example, 95 μm or less, preferably 75 μm or less.

In each product region R1, the terminal portion 20B is electrically connected to a wiring (for example, the conductive layer 22) of the wiring portion 20A. The terminal portion 20B is thicker than the conductive layer 22 of the wiring portion 20A. In the present embodiment, the terminal portion 20B includes the conductive layer 24 (second conductive layer) and the conductive layer 25 (third conductive layer), and the conductive layers 24 and 25 are laminated in the thickness direction. The terminal portion 20B may have a configuration consisting of a single conductive layer instead of such a configuration in which the plurality of conductive layers are laminated.

The conductive layer 24 has a predetermined pattern shape on one surface in the thickness direction of the insulating layer 21, and is structurally and electrically connected to the wiring (for example, the conductive layer 22) of the wiring portion 20A. A thickness of the conductive layer 24 is, for example, 3 μm or more, preferably 5 μm or more, and for example, 50 μm or less, preferably 30 μm or less. The thickness of the conductive layer 24 may be the same as that of the conductive layer 22 of the wiring portion 20A.

The conductive layer 25 is located on one surface in the thickness direction of the conductive layer 24, and has an outer shape which fits within the outer shape of the conductive layer 24 when viewed from the top. A thickness of the conductive layer 25 is, for example, 3 μm or more, preferably 5 μm or more, and for example, 50 μm or less, preferably 30 μm or less. Materials for the conductive layers 24 and 25 are preferably the same, and more preferably copper. The materials for the conductive layers 24 and 25 may be also different.

A height H2 of the terminal portion 20B from the metal substrate 10 (distance from the metal substrate 10 to the upper end of the terminal portion 20B in FIG. 2) is, for example, 6 μm or more, preferably 8 μm or more, and for example, 100 μm or less, preferably 80 μm or less. The height H2 of the terminal portion 20B is preferably greater than the height H1 of the wiring portion 20A (illustratively showing a case where the height H2 is greater than the height H1).

The dummy structure portion 30 is, as shown in FIG. 2, disposed on one surface in the thickness direction of the metal substrate 10 in the frame region R2. The dummy structure portion 30 has the insulating layer 31 (dummy base insulating layer), a plurality of dummy conductive layer 32 (first dummy conductive layer) and dummy conductive layer 33 (second dummy conductive layer) aligned in the thickness direction, and the insulating layer 34 (first dummy cover insulating layer). Further, the dummy structure portion 30 extends in the first direction D1 on the extending portion 10A of the frame region R2. In the present embodiment, the dummy structure portion 30 is provided for each extending portion 10A. The insulating layer 31 in the dummy structure portion 30 is, as described later with reference to FIG. 3B, a portion (portion located within the frame region R2 of the metal substrate 10) of the insulating layer 100 which is pattern-formed on one surface in the thickness direction of the metal substrate 10. In FIG. 1, from the viewpoint of clarification, the contour of the dummy structure portion 30 is shown by hatching, while separately shown from the contour of the frame region R2 of the metal substrate 10.

The insulating layer 31 is located on one surface in the thickness direction of the metal substrate 10 in the frame region R2. The insulating layer 31 has a shape extending in the first direction D1 and including the dummy conductive layers 32 and 33 when viewed from the top. A thickness of the insulating layer 31 is, for example, 1 μm or more, preferably 3 μm or more, and for example, 35 μm or less, preferably 15 μm or less.

The dummy conductive layer 32 is located on one surface in the thickness direction of the insulating layer 31. The dummy conductive layer 32 has a shape extending in the first direction D1. A thickness of the dummy conductive layer 32 is, for example, 3 μm or more, preferably 5 μm or more, and for example, 50 μm or less, preferably 30 μm or less. The thickness of the dummy conductive layer 32 may be the same as the thickness of the conductive layer 22 of the wiring portion 20A and/or the thickness of the conductive layer 24 of the terminal portion 20B. A width of the dummy conductive layer 32 (dimension in a direction perpendicular to the extending direction of the dummy conductive layer 32) is, for example, 5 μm or more, preferably 8 μm or more, and for example, 100 μm or less, preferably 50 μm or less. Preferably, the width of the dummy conductive layer 32 on the extending portion 10a is wider than the width of the dummy conductive layer 32 on the extending portion 10b.

In the present embodiment, the dummy conductive layer 33 is located on one surface in the thickness direction of the dummy conductive layer 32, and extends in the first direction D1. That is, the dummy conductive layers 32 and 33 are laminated in the thickness direction. A thickness of the dummy conductive layer 33 is, for example, 3 μm or more, preferably 5 μm or more, and for example, 50 μm or less, preferably 30 μm or less. The thickness of the dummy conductive layer 33 may be the same as the thickness of the conductive layer 25 of the terminal portion 20B. A width of the dummy conductive layer 33 (dimension in a direction perpendicular to the extending direction of the dummy conductive layer 33) is, for example, 5 μm or more, preferably 8 μm or more, and for example, 100 μm or less, preferably 50 μm or less, as long as it is within the width of the dummy conductive layer 32.

The insulating layer 34 is disposed on one surface in the thickness direction of the insulating layer 31 so as to cover the laminated dummy conductive layers 32 and 33, and extends in the first direction D1. A height of the insulating layer 34 from the insulating layer 31 (distance from the insulating layer 31 to the upper end of the insulating layer 34 in FIG. 2) is, for example, 7 μm or more, preferably 10 μm or more, and for example, 110 μm or less, preferably 70 μm or less, as long as it is larger than the total thickness of the conductive layers 32 and 33.

The dummy structure portion 30 has a height greater than the terminal portion 20B on the metal substrate 10. Specifically in the present embodiment, in the terminal portion 20B and the dummy structure portion 30 disposed in the product region R1 and the frame region R2 respectively which are adjacent in the second direction D2, the dummy structure portion 30 has a greater height above the metal substrate 10 than the terminal portion 20B. A height H3 of the dummy structure portion 30 from the metal substrate 10 (distance from the metal substrate 10 to the upper end of the dummy structure portion 30 in FIG. 2) is, for example, 8 μm or more, preferably 10 μm or more, and for example, 150 μm or less, preferably 125 μm or less, as long as it is greater than the height H2 of the terminal portion 20B. A ratio (H3/H2) of the height H3 to the height H2 is, for example, 1 or more, preferably 1.01 or more, more preferably 1.05 or more, and for example, 3 or less, preferably 1.5 or less. A difference (H3−H2) between the height H3 and the height H2 is, for example, 0 μm or more, preferably 1 μm or more, more preferably 3 μm or more, and for example, 50 μm or less, preferably 30 μm or less. A ratio (H3/T) of the height H3 to the thickness T of the metal substrate 10 is, for example, 0.1 or more, preferably 0.2 or more, and for example, 10 or less, preferably 5 or less. When the assembly sheet X takes a form of a roll, these configurations are suitable for realizing contact suppression and a reduction in a contact load to be described later between the terminal portion 20B and the metal substrate 10, while suppressing an excessive increase in a roll diameter.

The dummy structure portion 30 preferably has a greater height above the metal substrate 10 than the wiring portion 20A. Specifically in the present embodiment, in the wiring portion 20A and the dummy structure portion 30 disposed in the product region R1 and the frame region R2 respectively which are adjacent in the second direction D2, the dummy structure portion 30 preferably has a greater height above the metal substrate 10 than the wiring portion 20A. In this case, a ratio (H3/H1) of the height H3 of the dummy structure portion 30 to the height H1 of the wiring portion 20A is, for example, 1 or more, preferably 1.01 or more, more preferably 1.05 or more, and for example, 3 or less, preferably 1.5 or less. When the height H3 is the height H1 or more, a difference (H3−H1) between the height H3 and the height H1 is, for example, 0 μm or more, preferably 1 μm or more, more preferably 3 μm or more, and for example, 50 μm or less, preferably 30 μm or less. When the assembly sheet X takes the form of the roll, these configurations are suitable for realizing the contact suppression and the reduction in the contact load to be described later between the wiring portion 20A and the metal substrate 10, while suppressing the excessive increase in the roll diameter.

The assembly sheet X having the above-described configuration may take the form of the roll in which a surface of the side at which the wiring circuit structure portion 20 and the dummy structure portion 30 are formed in the metal substrate 10 is, for example, wound in a manner located on the outer diameter-side. The assembly sheet X is capable of being conveyed and stored in the form of the roll.

FIGS. 3A to 4C show one example of a method for producing the assembly sheet X. FIGS. 3A to 4C show the present production method as a change in a cross section corresponding to FIG. 2. In the present production method, the following various treatment and process is carried out in a roll-to-roll method with respect to the work taking the form of the roll, thereby producing the assembly sheet X.

Figure 3A:
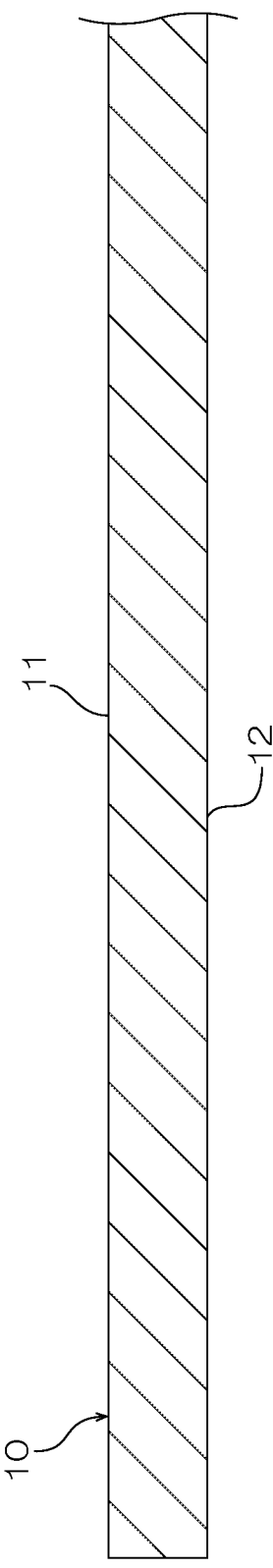
FIGS. 3A to 3C show a part of steps in a method for producing the wiring circuit board assembly sheet shown in FIG. 1 as a change in a cross section corresponding to FIG. 2.

In the present production method, first, as shown in FIG. 3A, the unprocessed metal substrate 10 in which the opening portion G is not formed is prepared (preparation step). The metal substrate 10 has a first surface 11 to be processed, and a second surface 12 at the opposite side thereto. In the present step, the metal substrate 10 is prepared in the form of the roll.

Figure 3B:
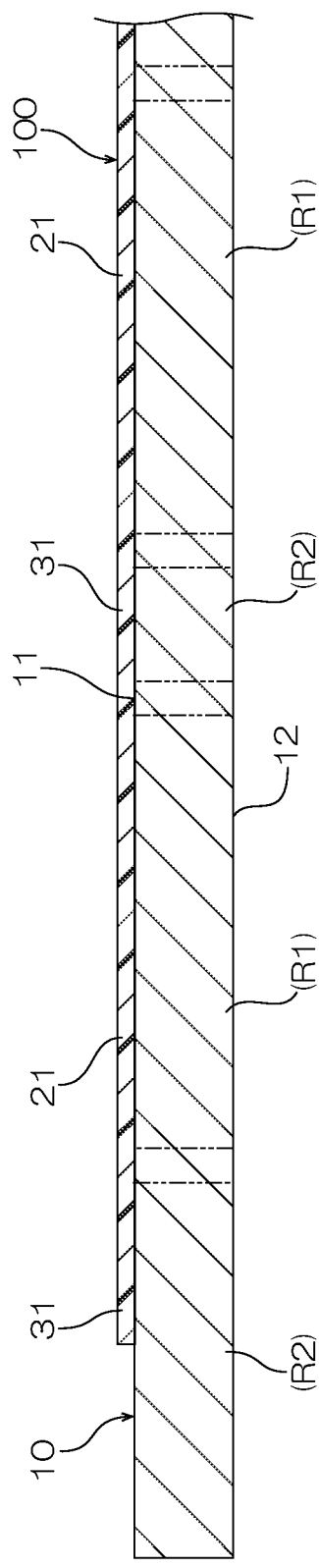

Next, as shown in FIG. 3B, the insulating layer 100 is pattern-formed on the first surface 11 of the metal substrate 10 (first insulating layer forming step). In this step, first, a solution (varnish) of a photosensitive resin is applied onto the first surface 11 of the metal substrate 10 to be dried, thereby forming a coating film. Next, the coating film on the metal substrate 10 is subjected to exposure treatment through a predetermined mask, subsequent development treatment, and, if necessary, bake treatment. In this way, the insulating layer 100 is formed on the metal substrate 10. The insulating layer 100 includes the insulating layer 21 on a region to be formed into the product region R1, and the insulating layer 31 on a region to be formed into the frame region R2.

Figure 3C:
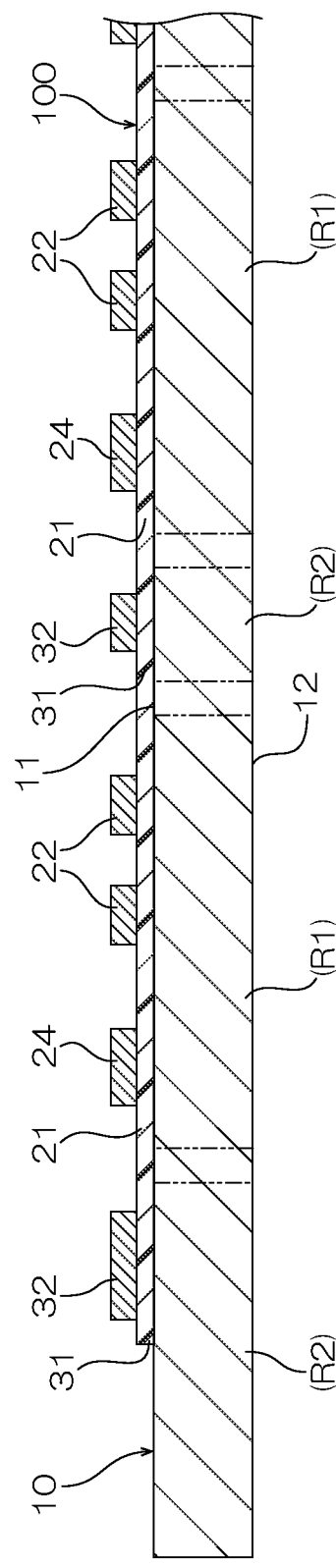

Next, as shown in FIG. 3C, the conductive layers 22 and 24 are pattern-formed on the insulating layer 21, and the conductive layer 32 is pattern-formed on the insulating layer 31 (first conductive layer forming step). In this step, first, a seed layer is formed by, for example, a sputtering method so as to cover the first surface 11 of the metal substrate 10 and the insulating layer 100 thereon. Examples of a material for the seed layer include Cr, Cu, Ni, Ti, and alloys of these (the same applies to materials for the seed layer to be described later). Next, a resist pattern is formed on the seed layer. The resist pattern has an opening portion having a shape corresponding to the pattern shape of the conductive layers 22, 24, and 32. In the formation of the resist pattern, for example, after the photosensitive resist film is provided onto the seed layer to form a resist film, the resist film is subjected to exposure treatment through a predetermined mask, subsequent development treatment, and if necessary, subsequent bake treatment (the same applies to the formation of the resist pattern to be described later). Next, a metal material such as copper is grown on the seed layer in the opening portion of the resist pattern by an electrolytic plating method. Next, the resist pattern is removed by etching. Next, a portion exposed by the resist pattern removal in the seed layer is removed by etching. In this way, it is possible to form the conductive layers 22, 24, and 32. In a process in which the production process is to be subsequently advanced in a roll-to roll method, the conductive layer 32 formed along with the conductive layers 22 and 24 at the first surface 11-side of the metal substrate 10 may be brought into contact with a roller such as a guide roller when the roller is brought into contact with the exposed surfaces (one surface in the thickness direction) of the conductive layers 22 and 24. In this manner, a roller contact load with respect to the conductive layers 22 and 24 is reduced, and damage to the conductive layers 22 and 24 due to the contact is prevented or suppressed.

In this production method, next, as shown in FIG. 4A, the conductive layer 25 is formed on the conductive layer 24, and the conductive layer 33 is formed on the conductive layer 32 (second conductive layer forming step). In this step, first, a seed layer is formed by, for example, a sputtering method so as to cover the first surface 11 of the metal substrate 10, the insulating layer 100, and the conductive layers 22, 24, and 32 thereon. Next, a resist pattern is formed on the seed layer. The resist pattern has an opening portion having a shape corresponding to the pattern shape of the conductive layers 25 and 33. Next, a metal material such as copper is grown on the seed layer in the opening portion of the resist pattern by an electrolytic plating method. Next, the resist pattern is removed by etching. Then, a portion exposed by the resist pattern removal in the seed layer is removed by etching. In this way, it is possible to form the conductive layer 25 on the conductive layer 24, and form the conductive layer 33 on the conductive layer 32. In this step, the terminal portion 20B is formed.

Next, as shown in FIG. 4B, the insulating layer 23 covering the conductive layer 22 is formed on the insulating layer 21, and the insulating layer 34 covering the laminated conductive layers 32 and 33 is formed on the insulating layer 31 (second insulating layer forming step). In this step, first, a solution (varnish) of a photosensitive resin is applied onto the first surface 11-side of the metal substrate 10 to be dried, thereby forming a coating film. Next, the coating film is subjected to exposure treatment through a predetermined mask, subsequent development treatment, and, if necessary, subsequent bake treatment. In this way, it is possible to form the insulating layers 23 and 34. In this step, the wiring portion 20A and the dummy structure portion 30 are formed.

Next, as shown in FIG. 4C, the opening portion G is formed in the metal substrate 10. In this step, the opening portion G is formed in the metal substrate 10 by etching treatment through a predetermined etching mask from the second surface 12-side with respect to the metal substrate 10. As an etching solution for the etching treatment, for example, ferric chloride is used.

It is possible to produce the assembly sheet X by, for example, passing through the steps as described above. In the assembly sheet X, by cutting or breaking a portion connecting between the predetermined product region R1 and the frame region R2 in the insulating layer 100, it is possible to cut off the product region R1, as a wiring circuit board, from the assembly sheet X.

The assembly sheet X, as described above, includes the dummy structure portion 30 on the frame region R2 having a greater height above the product region R1 than the terminal portion 20B at one surface-side in the thickness direction of the metal substrate 10. When the assembly sheet X takes the form of the roll, such a configuration is suitable for less causing the contact between the terminal portion 20B of the wiring circuit structure portion 20 and the metal substrate 10 adjacent to the terminal portion 20B at one side in the thickness direction thereof, and is also suitable for reducing the load received by the terminal portion 20B due to the contact. In addition, in the assembly sheet X, as described above, the dummy structure portion 30 includes a plurality of dummy conductive layers aligned in the thickness direction (in this embodiment, the dummy conductive layers 32 and 33 laminated in the thickness direction). Such a configuration is suitable for ensuring the height of the dummy structure portion 30 greater than the terminal portion 20B (in this embodiment, including the conductive layers 24 and 25 laminated in the thickness direction), and helps in the contact suppression and the reduction in the contact load described above between the terminal portion 20B and the metal substrate 10. Therefore, the assembly sheet X is suitable for suppressing damage to the terminal portion 20B of the wiring circuit structure portion 20 in the product region R1.

In the assembly sheet X, as described above, the plurality of dummy conductive layers 32 and 33 of the dummy structure portion 30 are laminated in the thickness direction. Such a configuration is suitable for efficiently forming each dummy conductive layer (the dummy conductive layers 32 and 33) of the dummy structure portion 30 having a height greater than the terminal portion 20B (in this embodiment, including the conductive layers 24 and 25 laminated in the thickness direction) in parallel with each conductive layer (the conductive layers 24 and 25) of the terminal portion 20B in the production process of the assembly sheet X.

As described above, in the assembly sheet X, the dummy structure portion 30 has a height greater than the wiring portion 20A on the metal substrate 10. When the assembly sheet X takes the form of the roll, such a configuration is suitable for less causing the contact between the wiring portion 20A of the wiring circuit structure portion 20 formed on the metal substrate 10 in each product region R1, and the metal substrate 10 adjacent to the wiring portion 20A at one side in the thickness direction thereof, and is also suitable for reducing the load received by the wiring portion 20A due to the contact. Therefore, the configuration is suitable for suppressing damage to the wiring (for example, the conductive layer 22) of the wiring portion 20A due to the contact with the metal substrate 10.

As described above, in the assembly sheet X, the terminal portion 20B is thicker than the conductive layer 22 of the wiring portion 20A. Such a configuration is suitable for ensuring the terminal portion 20B higher than the wiring portion 20A.

In the assembly sheet X, as described above, the terminal portion 20B includes the plurality of conductive layers 24 and 25 laminated in the thickness direction. Such a configuration is suitable for efficiently forming each dummy conductive layer (the conductive layers 32 and 33) of the dummy structure portion 30 in parallel with each conductive layer (the conductive layers 24 and 25) of the terminal portion 20B in the production process of the assembly sheet X.

As described above, the dummy structure portion 30 includes the insulating layer 34 covering the dummy conductive layers 32 and 33. Such a configuration is suitable for ensuring the height H3 of the dummy structure portion 30 above the metal substrate 10 greater than the height H2 of the terminal portion 20B.

In the assembly sheet X, as described above, the metal substrate 10 includes the product region row L including the plurality of product regions R1 aligned in the first direction D1, and the frame region R2 includes the extending portion 10A extending in the first direction D1 and adjacent to the product region row L in the second direction D2. Then, the dummy structure portion 30 is provided for each extending portion 10A, and extends in the first direction D1 on the extending portion 10A. According to such a configuration, it is possible to enjoy the above-described technical effect by the dummy structure portion 30 in the assembly sheet X over the entire region where the dummy structure portion 30 extends extending in the first direction D1 along each product region R1.

Figure 5:
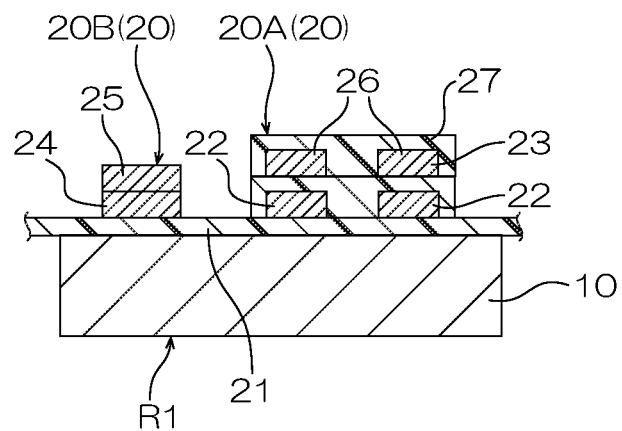
FIG. 5 shows a partially cross-sectional schematic view of one modified example of a wiring circuit board assembly sheet in which a wiring portion has a multilayer wiring structure.

The wiring portion 20A in the assembly sheet X may have a multilayer wiring structure. FIG. 5 shows one example of a multilayer wiring structure that the wiring portion 20A may have. The wiring portion 20A shown in FIG. 5 includes a conductive layer 26 (fourth conductive layer) and an insulating layer 27 (second cover insulating layer) on one surface in the thickness direction of the metal substrate 10 in addition to the insulating layer 21, the conductive layer 22, and the insulating layer 23 (FIG. 5 illustratively shows a two-layer wiring structure as a multilayer wiring structure). The conductive layer 26 is located on one surface in the thickness direction of the insulating layer 23. A thickness, a width, and a material of the conductive layer 26 are the same as those described above of the conductive layer 22. The insulating layer 27 is disposed on one surface in the thickness direction of the insulating layer 23 so as to cover the conductive layer 26. A height (distance from the insulating layer 23 to the upper end of the insulating layer 27 in FIG. 5) and a material of the insulating layer 27 are the same as the thickness (distance from the insulating layer 21 to the upper end of the insulating layer 23 in FIG. 2) and the material described above of the insulating layer 23. The conductive layer 26 may or may not be overlapped with the conductive layer 22 when projected in the thickness direction (illustratively showing a case of being overlapped). From the viewpoint of high density of the wiring in the wiring portion 20A, the conductive layer 26 is preferably overlapped with the conductive layer 22 when projected in the thickness direction. A configuration in which the wiring portion 20A has such a multilayer wiring structure is suitable for achieving the high density of the wiring.

Figure 6A:
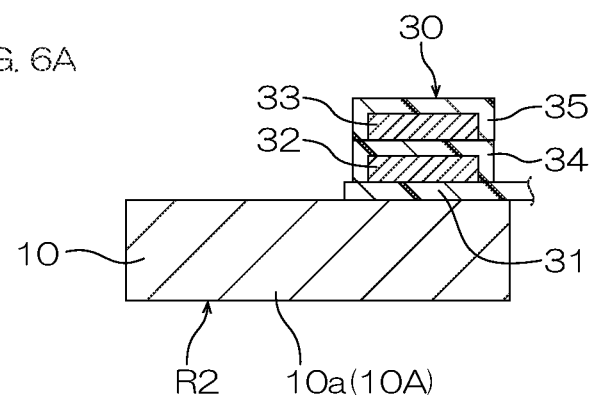
FIGS. 6A and 6B show partially cross-sectional schematic views of another modified example of a wiring circuit board assembly sheet in which a dummy structure portion has a dummy structure corresponding to a multilayer wiring structure.
Figure 6B:
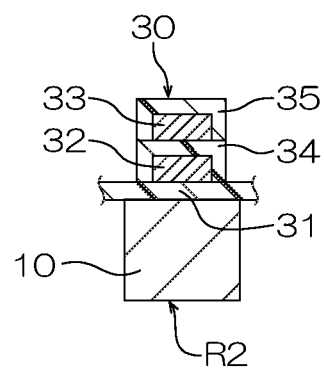

The dummy structure portion 30 in the assembly sheet X may also have a dummy structure corresponding to the multilayer wiring structure. FIGS. 6A and 6B each shows one example of a multilayer wiring structure-type dummy structure that the dummy structure portion 30 may have (FIG. 6A shows the dummy structure portion 30 on the extending portion 10a, and FIG. 6B shows the dummy structure portion 30 on the extending portion 10b). The dummy structure portion 30 shown in FIGS. 6A and 6B includes the plurality of conductive layers 32 and 33 aligned at spaced intervals from each other in the thickness direction on the insulating layer 31, the insulating layer 34 disposed on the insulating layer 31 so as to cover the conductive layer 32, and an insulating layer 35 (second dummy cover insulating layer) disposed on the insulating layer 34 so as to cover the conductive layer 33; instead of the conductive layers 32 and 33 laminated on one surface in the thickness direction of the insulating layer 31, and the insulating layer 34 covering the conductive layers 32 and 33 (FIGS. 6A and 6B illustratively show a two-layer wiring structure-type dummy structure). A material for the insulating layer 35 is the same as that for the insulating layer 34. A height of the insulating layer 35 from the insulating layer 34 (distance from the insulating layer 34 to the upper end of the insulating layer 35 in the drawing) is, for example, 4 μm or more, preferably 6 μm or more, and for example, 60 μm or less, preferably 40 μm or less, as long as it is larger than the thickness of the conductive layer 33. A configuration in which the dummy structure portion 30 includes the plurality of conductive layers 32 and 33 aligned at spaced intervals from each other in the thickness direction is suitable for ensuring the height of the dummy structure portion 30, and when the wiring portion 20A has a multilayer wiring structure suitable for the high density, in particular, it is suitable for ensuring the height of the dummy structure portion 30 greater than the wiring portion 20A.

FIG. 7 shows a partially cross-sectional schematic view in which the assembly sheet X includes both the wiring portion 20A shown in FIG. 5 and the dummy structure portions 30 shown in FIGS. 6A and 6B. To produce such an assembly sheet X, after the above-described first conductive layer forming step with reference to FIG. 3C, first, as shown in FIG. 8A, the insulating layer 23 covering the conductive layer 22 is formed on the insulating layer 21, and the insulating layer 34 covering the conductive layer 32 is formed on the insulating layer 31 (second insulating layer forming step). In this step, first, a solution (varnish) of a photosensitive resin is applied to the first surface 11-side of the metal substrate 10 to be dried, thereby forming a coating film. Next, the coating film is subjected to exposure treatment through a predetermined mask, subsequent development treatment, and if necessary, subsequent bake treatment.

Next, as shown in FIG. 8B, the conductive layer 26 is formed on the insulating layer 23, the conductive layer 25 is formed on the conductive layer 24, and the conductive layer 33 is formed on the insulating layer 34 (second conductive layer forming step). In this step, first, a seed layer is formed so as to cover the first surface 11 of the metal substrate 10, the insulating layers 23 and 34, and the conductive layer 24 thereon by, for example, a sputtering method. Next, a resist pattern is formed on the seed layer. The resist pattern has an opening portion having a shape corresponding to the pattern shape of the conductive layers 26 and 33. Next, a metal material such as copper is grown on the seed layer in the opening portion of the resist pattern by an electrolytic plating method. Next, the resist pattern is removed by etching. Then, a portion exposed by the resist pattern removal in the seed layer is removed by etching. In this way, it is possible to form the conductive layers 25, 26, and 33. In this step, the terminal portion 20B is formed.

Next, as shown in FIG. 8C, the insulating layer 27 covering the conductive layer 26 is formed on the insulating layer 23, and the insulating layer 35 covering the conductive layer 33 is formed on the insulating layer 34 (third insulating layer forming step). In this step, first, a solution (varnish) of a photosensitive resin is applied to the first surface 11-side of the metal substrate 10 to be dried, thereby forming a coating film. Next, the coating film is subjected to exposure treatment through a predetermined mask, subsequent development treatment, and if necessary, subsequent bake treatment. In this way, it is possible to form the insulating layers 27 and 35. In this step, the wiring portion 20A and the dummy structure portion 30 are formed.

Thereafter, in the same manner as described above with reference to FIG. 4C, the opening portion G is formed in the metal substrate 10 by etching treatment through a predetermined etching mask with respect to the metal substrate 10. It is possible to produce the assembly sheet X having the structure shown in FIG. 7 by, for example, passing through the steps described above.

Figure 9:
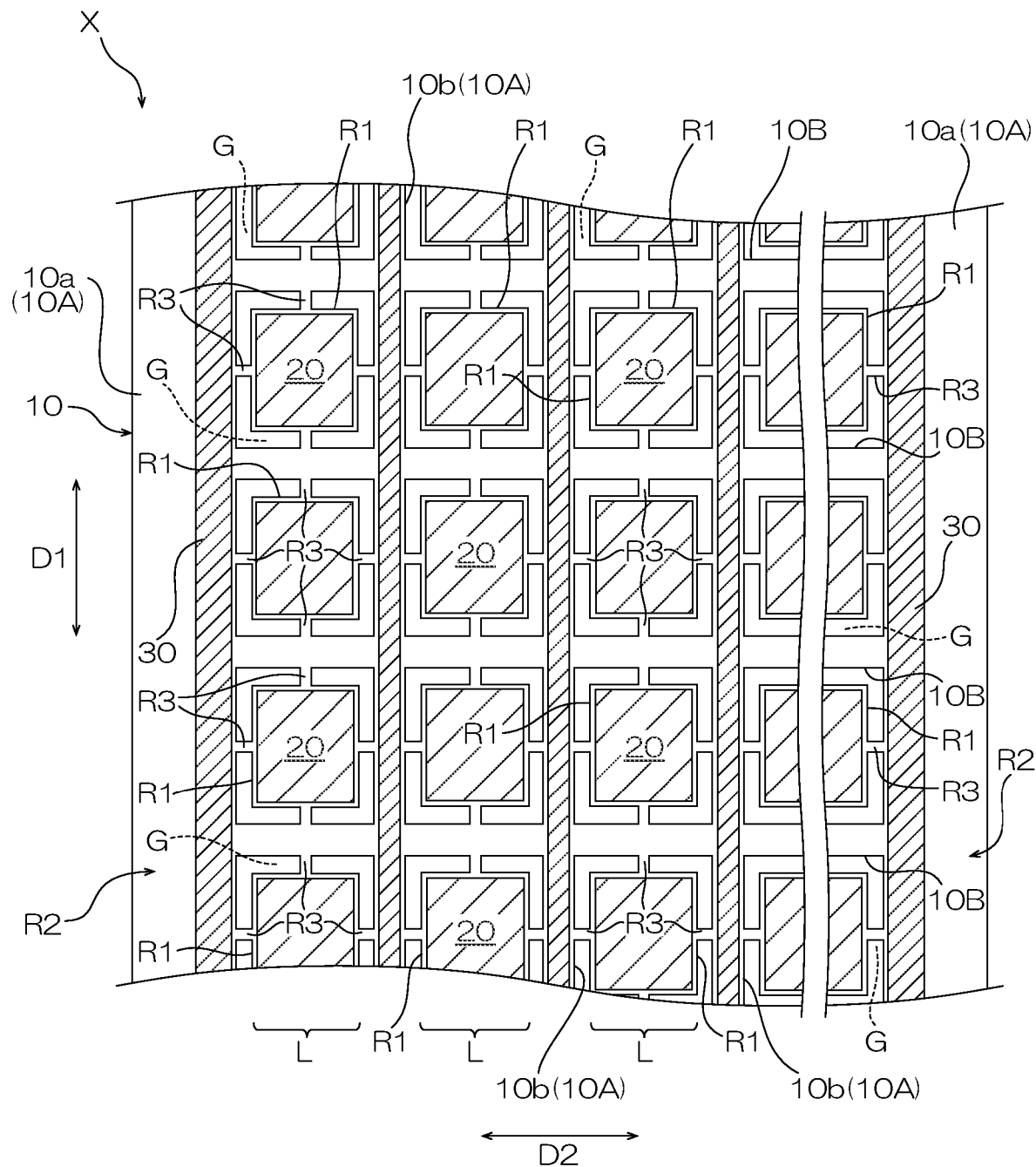
FIG. 9 shows a partially plan schematic view of another modified example of a wiring circuit board assembly sheet.
Figure 10:
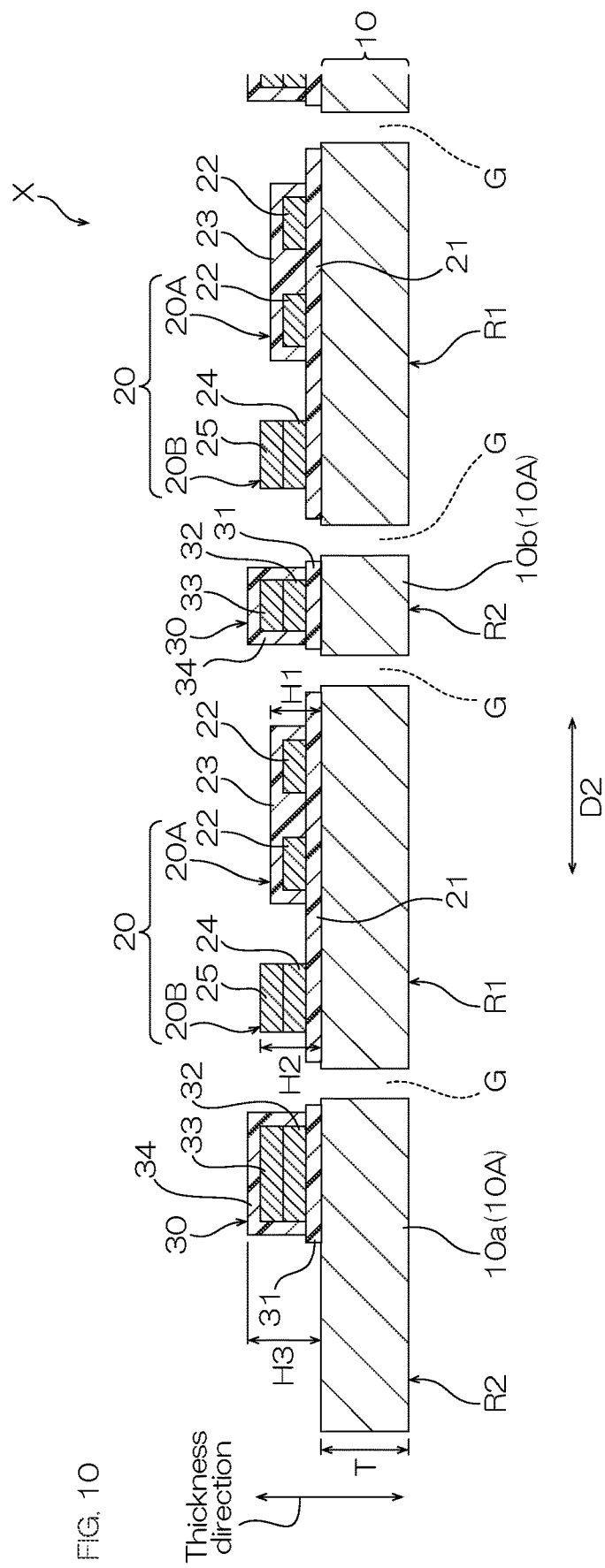
FIG. 10 shows a partially cross-sectional schematic view in a width direction of the wiring circuit board assembly sheet shown in FIG. 9.

As shown in FIGS. 9 and 10, the assembly sheet X may also include a configuration in which the insulating layer 21 of the wiring circuit structure portion 20 on the product region R1, and the insulating layer 31 of the dummy structure portion 30 on the frame region R2 are separated, or a configuration in which each product region R1 and the frame region R2 are connected via a predetermined number of connecting portions R3 (illustratively showing a case where each product region R1 and the frame region R2 are connected via the four connecting portions R3). In the production process of the assembly sheet X, the connecting portion R3 is formed by the etching treatment in the above-described process with reference to FIG. 4C. By cutting the connecting portion R3 in the assembly sheet X to be produced, it is possible to cut off the product region R1, as a wiring circuit board, from the assembly sheet X. Also, in such a modified example, each technical effect described above is achieved with respect to the assembly sheet X.

Figure 11:
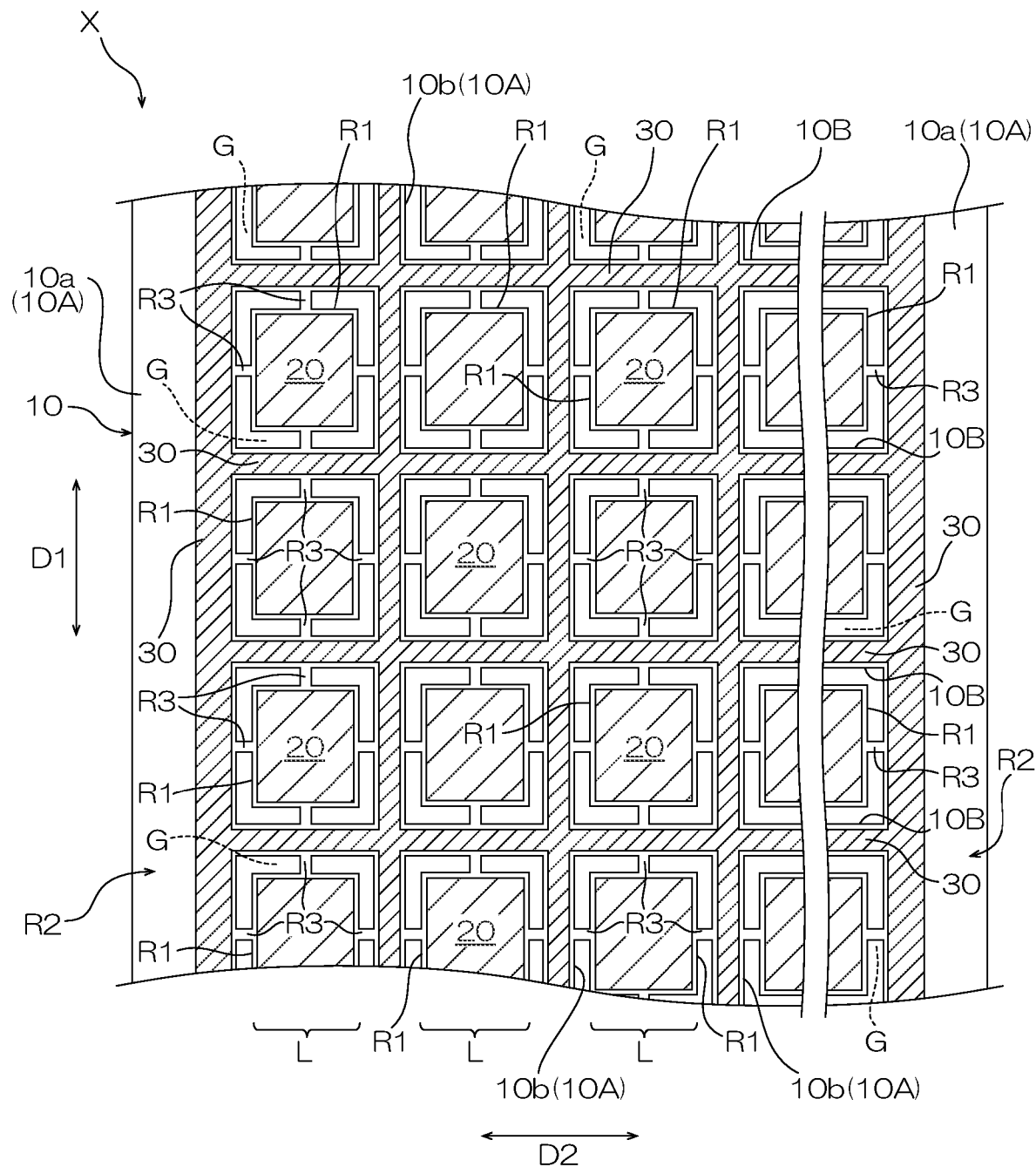
FIG. 11 shows a partially plan schematic view of another modified example of a wiring circuit board assembly sheet.

The assembly sheet X may also include the dummy structure portion 30 on the extending portion 10B in addition to the extending portion 10A (FIG. 11 illustratively shows a case where the assembly sheet X shown in FIGS. 9 and 10 includes the dummy structure portion 30 also on the extending portion 10B in addition to the extending portion 10A).

The dummy structure portion 30 on the extending portion 10B has the same configuration as the dummy structure portion 30 on the extending portion 10A, except that it extends in the second direction D2 instead of the first direction D1. Specifically, the dummy structure portion 30 on the extending portion 10B has a laminate structure shown in FIG. 2 or 6B in the same manner as the dummy structure portion 30 on the extending portion 10A. In such a modified example, each technical effect described above is achieved with respect to the assembly sheet X.

Further, the assembly sheet X may also include the dummy structure portion 30 on the extending portion 10B instead of including the dummy structure portion 30 on the extending portion 10a and the extending portion 10b. Also, in such a modified example, each technical effect described above is achieved with respect to the assembly sheet X.

INDUSTRIAL APPLICATION

The wiring circuit board assembly sheet of the present invention can be used for assembly sheets for producing various flexible wiring circuit boards.

DESCRIPTION OF REFERENCE NUMERALS

X Assembly sheet (wiring circuit board assembly sheet)
10 Metal substrate
R1 Product region
R2 Frame region
R3 Connecting portion
10A, 10B, 10a, 10b, Extending portion
G Opening portion
20 Wiring circuit structure portion
20A Wiring portion
20B Terminal portion
21, 23, 27 Insulating layer
22, 24, 25, 26 Conductive layer
30 Dummy structure portion
31, 34 Insulating layer
32, 33 Conductive layer

The invention claimed is:

1. A wiring circuit board assembly sheet comprising:
a metal substrate including a product region and a frame region adjacent to the product region,
a wiring circuit structure portion including a terminal portion and disposed on one surface in a thickness direction of the metal substrate in the product region, and
a dummy structure portion disposed on one surface in the thickness direction of the metal substrate in the frame region, wherein
the dummy structure portion includes a plurality of dummy conductive layers aligned in the thickness direction, and has a greater height above the metal substrate than the terminal portion.

2. The wiring circuit board assembly sheet according to claim 1, wherein
the plurality of dummy conductive layers of the dummy structure portion are laminated in the thickness direction.

3. The wiring circuit board assembly sheet according to claim 1, wherein
the wiring circuit structure portion includes a wiring portion, and
the dummy structure portion has a greater height above the metal substrate than the wiring portion.

4. The wiring circuit board assembly sheet according to claim 3, wherein
the wiring portion of the wiring circuit structure portion includes a plurality of conductive layers aligned at spaced intervals from each other in the thickness direction, and
the plurality of dummy conductive layers of the dummy structure portion are aligned at spaced intervals from each other in the thickness direction.

5. The wiring circuit board assembly sheet according to claim 4, wherein
the terminal portion is thicker than the conductive layer of the wiring portion.

6. The wiring circuit board assembly sheet according to claim 1, wherein
the terminal portion includes a plurality of conductive layers laminated in the thickness direction.

7. The wiring circuit board assembly sheet according to claim 1, wherein
the dummy structure portion includes an insulating layer covering the dummy conductive layer.

8. The wiring circuit board assembly sheet according to claim 1, wherein
the metal substrate extends in a first direction and has a width in a second direction perpendicular to the first direction,
the frame region includes an extending portion extending in the first direction and being adjacent to the product region in the second direction, and
the dummy structure portion extends in the first direction on the extending portion.

9. The wiring circuit board assembly sheet according to claim 1, wherein
the metal substrate extends in a first direction, has a width in a second direction perpendicular to the first direction, and includes at least one row of product region row including a plurality of the product regions aligned in the first direction;
the frame region includes at least one extending portion extending in the first direction and being adjacent to the product region row in the second direction; and
the dummy structure portion is provided for each extending portion and extends in the first direction on the extending portion.

* * * * *